US012761279B2

(12) United States Patent
Kong et al.

(10) Patent No.: US 12,761,279 B2
(45) Date of Patent: Oct. 13, 2026

(54) BATTERY CAPACITY MEASURING DEVICE AND METHOD. AND BATTERY CONTROL SYSTEM COMPRISING BATTERY CAPACITY MEASURING DEVICE

(71) Applicant: LG Chem, Ltd., Seoul (KR)

(72) Inventors: Changsun Kong, Daejeon (KR); Sunmin Kim, Daejeon (KR); Kyu Hwang Lee, Daejeon (KR); Byung Kwun Kang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 751 days.

(21) Appl. No.: 18/018,629

(22) PCT Filed: Nov. 12, 2021

(86) PCT No.: PCT/KR2021/016484
§ 371 (c)(1),
(2) Date: Jan. 30, 2023

(87) PCT Pub. No.: WO2022/103185
PCT Pub. Date: May 19, 2022

(65) Prior Publication Data

US 2023/0213586 A1 Jul. 6, 2023

(30) Foreign Application Priority Data

Nov. 13, 2020 (KR) ........................ 10-2020-0151880

(51) Int. Cl.
*G01R 31/367* (2019.01)
*G01R 31/387* (2019.01)
(Continued)

(52) U.S. Cl.
CPC ......... *G01R 31/367* (2019.01); *G01R 31/387* (2019.01); *G06N 20/00* (2019.01); *H02J 7/80* (2026.01)

(58) Field of Classification Search
CPC ................ G01R 31/367; G01R 31/387; G01R 31/3865; G01R 31/3648; G01R 31/385;
(Continued)

(56) References Cited

U.S. PATENT DOCUMENTS 9,255,973 B2 2/2016 Song et al.
9,316,699 B2 4/2016 Baek et al.
(Continued)

FOREIGN PATENT DOCUMENTS

CN 1890574 A 1/2007
CN 109298351 A 2/2019
(Continued)

OTHER PUBLICATIONS

International Search Report for PCT/KR2021/016484 mailed Mar. 2, 2022. 4 pgs.

(Continued)

*Primary Examiner* — Thomas M Hammond, III
(74) *Attorney, Agent, or Firm* — Lerner David LLP

(57) ABSTRACT

A device and method for measuring the capacity of a battery including an input interface to receive capacity factor learning data learning battery selected as a learning target and capacity factor measurement data of a prediction battery selected as a prediction target, and one or more processors configured to derive a capacity distribution of the prediction battery from the capacity factor learning data, perform a different respective machine learning program for each battery capacity range of the capacity distribution, and calculate capacity prediction data of the prediction battery based on results of the plurality of different respective machine learning programs, and an output interface to output the battery capacity prediction data.

16 Claims, 4 Drawing Sheets

(51) Int. Cl.
*G06N 20/00* (2019.01)
*H02J 7/80* (2026.01)

(58) Field of Classification Search
CPC ...... G01R 31/389; G01R 31/396; G06N 5/01; G06N 7/01; G06N 20/20; G06N 3/08; H02J 7/0048; H02J 7/00712; Y02E 60/10
See application file for complete search history.

(56) References Cited

U.S. PATENT DOCUMENTS

| | | | |
|---|---|---|---|
| 10,006,967 | B2 | 6/2018 | Ganesan et al. |
| 10,254,349 | B2 | 4/2019 | Kim et al. |
| 2005/0194936 | A1 | 9/2005 | Cho, II |
| 2015/0369874 | A1 | 12/2015 | Park et al. |
| 2016/0239759 | A1 * | 8/2016 | Sung ..................... H01M 10/48 |
| 2017/0115355 | A1 * | 4/2017 | Willard .............. G01R 31/3648 |
| 2017/0350944 | A1 * | 12/2017 | Pajovic .............. G01R 31/3648 |
| 2018/0136285 | A1 | 5/2018 | You et al. |
| 2018/0306868 | A1 | 10/2018 | Kim et al. |
| 2019/0257886 | A1 | 8/2019 | Hooshmand et al. |
| 2020/0011932 | A1 | 1/2020 | Hooshmand et al. |
| 2020/0041570 | A1 | 2/2020 | Izumi et al. |
| 2020/0209319 | A1 | 7/2020 | Mitsui et al. |
| 2020/0386819 | A1 * | 12/2020 | Lee ...................... G01R 31/382 |

FOREIGN PATENT DOCUMENTS

| | | | |
|---|---|---|---|
| CN | 109934294 | A | 6/2019 |
| CN | 111157908 | A | 5/2020 |
| JP | 2003249271 | A | 9/2003 |
| KR | 20040051195 | A | 6/2004 |
| KR | 20090020362 | A | 2/2009 |
| KR | 20130113296 | A | 10/2013 |
| KR | 20160000317 | A | 1/2016 |
| KR | 20170045140 | A | 4/2017 |
| KR | 101792975 | B1 | 11/2017 |
| KR | 20180055192 | A | 5/2018 |
| KR | 101944313 | B1 | 2/2019 |
| WO | 2018229597 | A1 | 12/2018 |

OTHER PUBLICATIONS

Extended European Search Report for Application No. 21892352.2 dated Dec. 7, 2023. 7 pgs.

* cited by examiner

[Fig. 1]
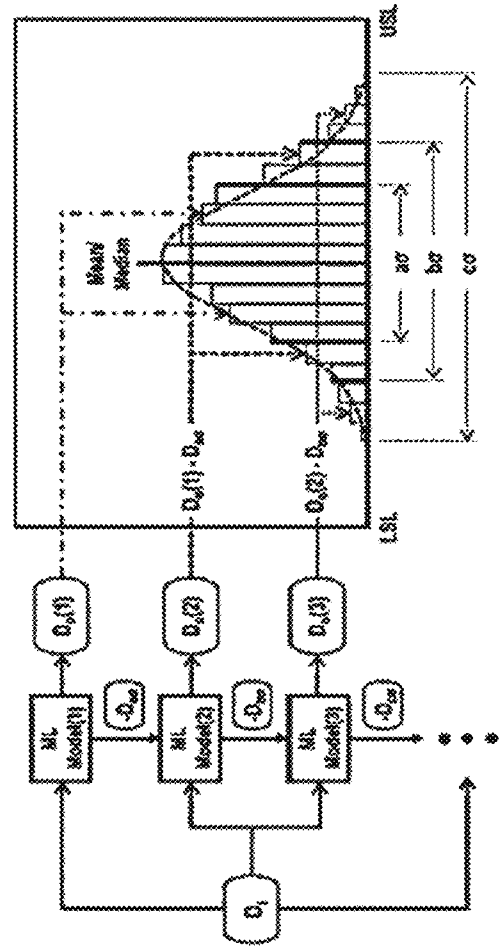

【Fig. 2】
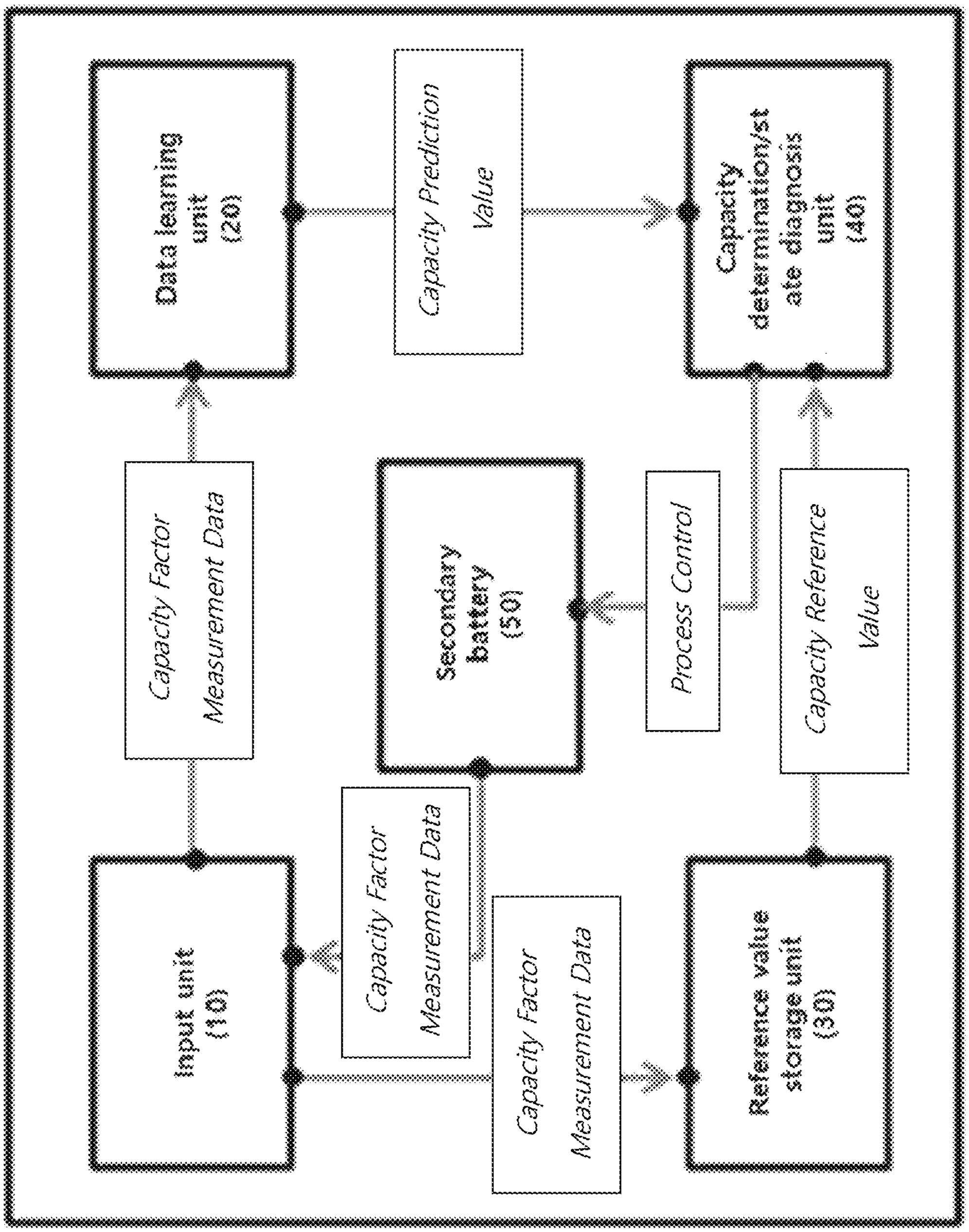

[Fig. 3]
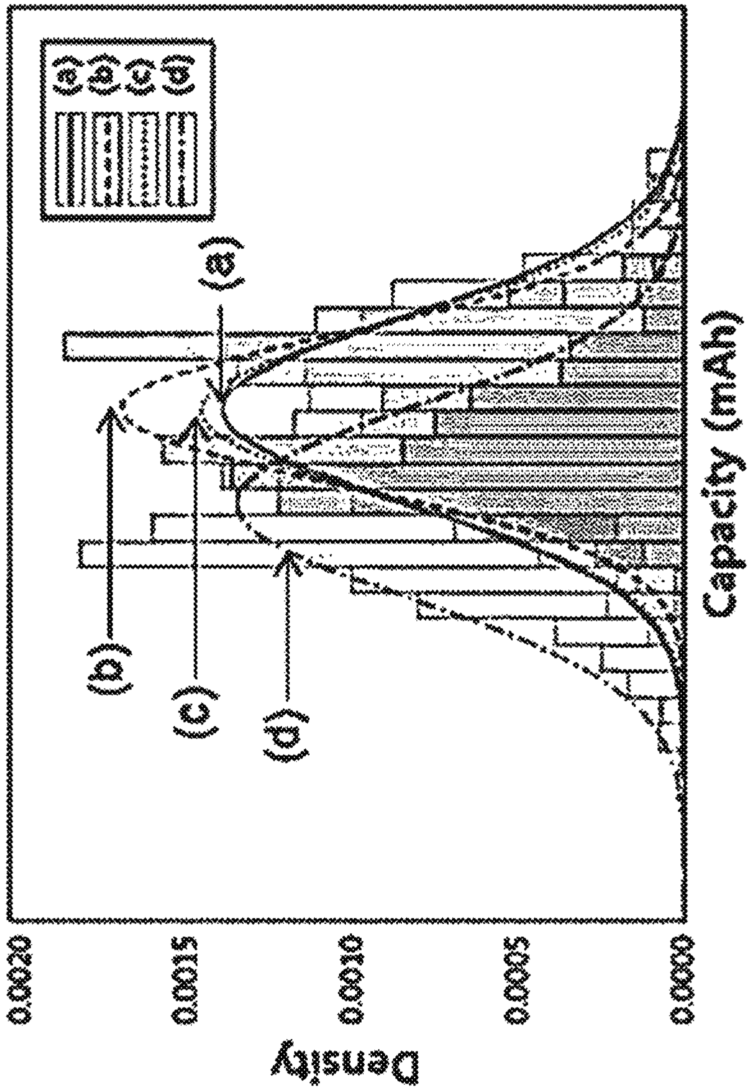

[Fig. 4]
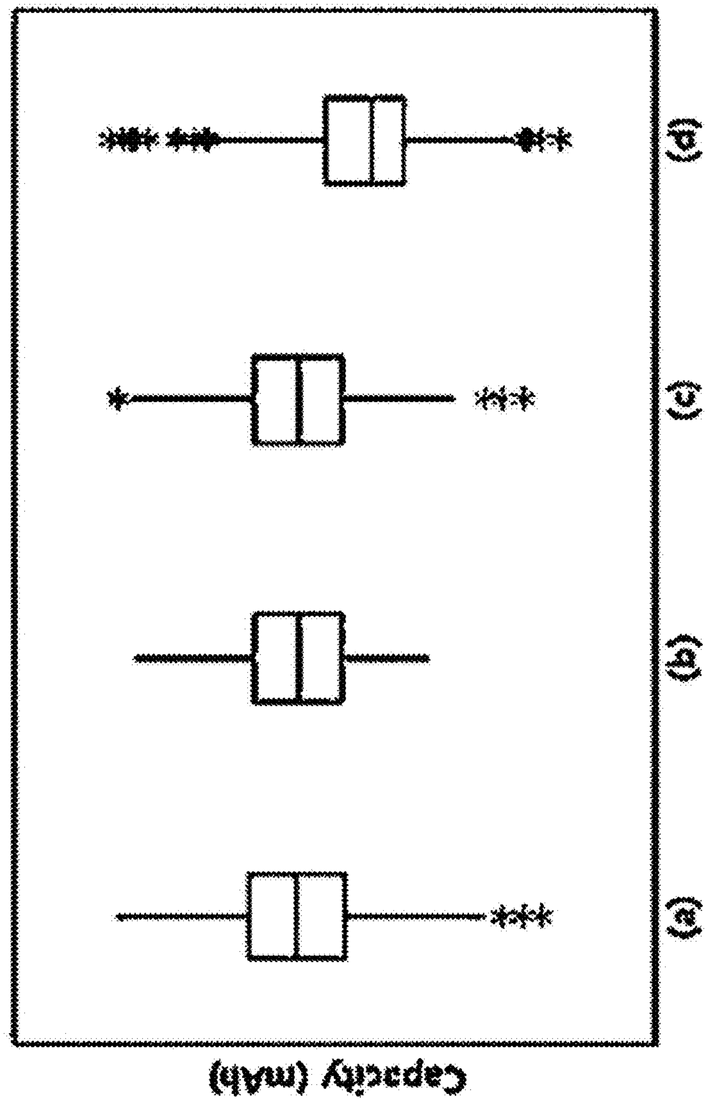

BATTERY CAPACITY MEASURING DEVICE AND METHOD. AND BATTERY CONTROL SYSTEM COMPRISING BATTERY CAPACITY MEASURING DEVICE

CROSS-REFERENCE TO RELATED APPLICATIONS

The present application is a national phase entry under 35 U.S.C. § 371 of International Application No. PCT/KR2021/016484, filed on Nov. 12, 2021, which claims priority from Korean Patent Application No. 10-2020-0151880, filed Nov. 13, 2020, the entire contents of which are incorporated herein by reference.

TECHNICAL FIELD

The present application relates to a device and method for measuring the capacity of a battery.

The present application relates to a battery management system device including the device for measuring the capacity of a battery.

The present application relates to a mobile apparatus including the battery management system device.

The present application relates to a computer program stored in a recording medium for executing a method for measuring the capacity of a battery.

BACKGROUND ART

The demand for secondary batteries in electric vehicles, mobile devices, etc. is rapidly expanding, and the requirements for condition diagnosis and quality stability of the secondary batteries are increasing.

A pass decision is made when the capacity of a secondary battery satisfies the rated capacity, which is a predetermined criterion, by sampling a certain number of batteries from a battery tray produced in the cycle charge/discharge process and continuously charging and discharging the sampled batteries.

The capacity of such a secondary battery is expressed in the form of a dispersion having a certain level or more of deviation within a range of upper and lower limits of the rated capacity, and deviations occur in the results depending on battery manufacturing method and manufacturing conditions and measurement conditions of temperature, humidity, charging rate, and discharging rate to be measured.

Although the deviations occur depending on such measurement conditions, the capacity value to be measured during charging or discharging is often measured under conditions different from the operating conditions specified in the battery specification.

Further, even if batteries are determined to be good products as a result of the capacity measurement, various situations may occur thereafter while actually operating or using (charging and discharging) a module or pack composed of a plurality of batteries corresponding to the good products.

That is, even when the module or pack is actually operated or used, continuous battery capacity measurement and condition diagnosis are required.

However, deviations occur in the results depending on measurement conditions such as temperature, humidity, charging rate, and discharging rate to be measured even during capacity measurement and condition diagnosis of batteries used in the module or pack as in the production process.

Therefore, in a production process of batteries and a process of actually operating a module or pack composed of a plurality of batteries, there is a need for a method capable of determining the quality of the batteries and diagnosing the battery condition by monitoring the state of the batteries in real time, correcting the deviation between capacity measurement values caused by the difference in the measurement conditions, and then measuring the capacity of secondary batteries, and a device capable of implementing the corresponding method.

<Patent Document> Korean Patent Application Publication No. 10-2004-0051195

SUMMARY

Technical Problem

An object of the present application is to provide a device and method capable of measuring the capacity of a battery by correcting the influence of battery usage conditions.

Technical Solution

An embodiment of the present disclosure provides a device for measuring battery capacity, the device including: an input interface configured to receive: capacity factor learning data measured in a first charging and discharging process performed for a specific time on a single learning battery selected as a learning target; and capacity factor measurement data of the prediction battery selected in a second charging and discharging process performed for a specific time of a prediction battery selected as a prediction target; one or more processors configured to: derive a capacity distribution of the prediction battery from the capacity factor learning data; for each battery capacity range of the capacity distribution of the prediction battery derived from the capacity factor learning data, perform a different respective machine learning program; and calculate capacity prediction data of the prediction battery based on results of the plurality of different respective machine learning programs; and an output interface configured to output the battery capacity prediction data respectively calculated for each battery capacity range of the capacity distribution derived from the capacity factor learning data.

Another embodiment of the present disclosure provides a method for measuring battery capacity, the method comprising the steps of: receiving, by an input interface, capacity factor learning data in a first charging and discharging process performed for a specific time of a learning battery selected as a learning target; deriving, by one or more processors, a capacity distribution of the from the input capacity factor learning data; for each battery capacity range of the capacity distribution of the prediction battery derived from the capacity factor learning data, performing, by the one or more processors, a different respective machine learning program; receiving, by the input interface, capacity factor measurement data of the prediction battery selected in a second charging and discharging process performed for a specific time of a prediction battery selected as a prediction target; calculating, by the one or more processors, capacity prediction data of the prediction battery based on results of the plurality of different respective machine learning programs; and outputting, by an output interface, the battery capacity prediction data respectively calculated for each battery capacity range of the capacity distribution derived from the capacity factor learning data.

An embodiment of the present disclosure provides a battery management system device including a device for measuring the capacity of a battery as described in any of the embodiments herein.

An embodiment of the present disclosure relates to a mobile apparatus including a battery management system device as described in any of the embodiments herein.

Finally, an embodiment of the present disclosure relates to a non-transitory computer-readable medium having stored thereon program instructions for causing one or more processors to execute a method for measuring battery capacity as described in any of the embodiments herein.

Advantageous Effects

The device and method for measuring the capacity of a battery according to an embodiment of the present application can improve the accuracy for measurement of the battery capacity and can reduce the battery manufacturing and capacity measurement costs in the process by correcting the influence of the battery usage conditions.

The device and method for measuring the capacity of a battery according to an embodiment of the present application can improve the accuracy of diagnosing the state of the battery and predicting the lifespan of the battery by improving the accuracy for measurement of the battery capacity.

The device and method for measuring the capacity of a battery according to an embodiment of the present application can improve the efficiency of quality control of battery products and the efficiency of the battery activation process by providing a cost-effective and accurate capacity measurement method and improving the accuracy for measurement of the battery capacity.

When a plurality of batteries in the form of a module, a pack, and a tray are mounted on electric vehicles, mobile devices, etc. and used as power sources, the device and method for measuring the capacity of a battery according to an embodiment of the present application can improve the accuracy of the measured capacity of individual batteries when performing capacity matching and cell balancing, and can improve the lifespan of the batteries in the form of a module, a pack, and a tray as a result.

BRIEF DESCRIPTION OF THE DRAWINGS

FIG. 1 is a diagram showing a process of applying a device and method for measuring the capacity of a battery of the present application.

FIG. 2 is a diagram schematically showing the configuration of a device for measuring the capacity of a battery of the present application.

FIGS. 3 and 4 are respectively a capacity distribution comparison diagram and a box plot which show derivation results according to Example and Comparative Example.

DETAILED DESCRIPTION

Hereinafter, the present disclosure will be described in detail so that those with ordinary skill in the art will easily be able to implement the present disclosure. However, the present disclosure may be embodied in various different forms and is not limited only to the configuration described herein.

In the present specification, if a prescribed part "includes" a prescribed element, this means that another element can be further included instead of excluding other elements unless any particularly opposite description exists.

In the present specification, the meaning of 'at least one' means one or more and all or less, for example, the meaning of 'at least one of A, B, and C' refers to including all of the case where there is one such as A, B, or C, the case where there are two such as A and B, A and C, and B and C, and the case where there are three (all) such as A to C.

That is, in the present specification, "learning data" refers to data for machine learning.

Further, in the present specification, "measurement data" refers to data to be input in order to calculate "prediction data", and the prediction data refers to data to be output as a result of reflecting machine learning on the input measurement data.

Further, in the present specification, "capacity factor learning data" is learning data for making accurate capacity measurement results using machine learning, and refers to data including battery charge voltage, battery discharge voltage, battery charge current, battery discharge current, battery charge capacity, battery discharge capacity, battery impedance, battery temperature, etc. measured, collected, and stored in the state of charging, discharging, and resting the battery by corresponding to the capacity measurement values for the rated capacity of individual batteries. However, the capacity factor learning data is not limited to including the factors as described above, and all factors that affect the battery capacity and can be measured and collected may be included.

Further, in the present specification, "capacity factor measurement data" is measurement data for making an accurate capacity measurement result using machine learning, and refers to data including battery charge voltage, battery discharge voltage, battery charge current, battery discharge current, battery charge capacity, battery discharge capacity, battery impedance, battery temperature, etc. measured, collected, and stored in the state of charging, discharging, and resting the battery. The capacity measurement data may also include the factors as described above, does not limit the capacity factor measurement data, and may include all factors that affect the battery capacity and can be measured and collected.

An embodiment of the present disclosure provides a device for measuring the capacity of a battery, the device including: a learning data input unit 10 for receiving capacity factor learning data of the battery in a charging and discharging process performed for a specific time of a battery selected as a learning target; a measurement data input unit for receiving capacity factor measurement data of the battery selected in a charging and discharging process performed for a specific time of a battery selected as a prediction target; a data learning unit 20 for deriving the capacity distribution of the battery from the capacity factor learning data of the battery input to the learning data input unit, and respectively performing a plurality of different machine learnings for each battery capacity range of the capacity distribution of the battery derived from the learning data; and an output unit for calculating battery capacity prediction data from the input capacity factor measurement data of the battery, and outputting the battery capacity prediction data respectively calculated for each battery capacity range of the battery capacity distribution derived from the learning data through the results of the plurality of different machine learnings.

The capacity distribution of the battery is obtained as follows. After dividing the entire capacity range by constant or varying intervals between sections, the number of batteries having the corresponding capacity for each section is measured and displayed in the form of a bar chart.

In an embodiment of the present disclosure, the battery selected as the learning target and the battery selected as the prediction target may refer to individual batteries which are each independently disposed on a module, a pack, and a tray.

Here, machine learning is a field of artificial intelligence, and refers to a technology in which a computer program improves information processing ability through learning using data and processing experience, or a technology related thereto. The technology related to machine learning is widely known in the technical field to which the present disclosure pertains. That is, a detailed description of a specific learning algorithm for machine learning will be omitted.

In the present specification, "respectively performing a plurality of different machine learnings for each battery capacity range of the capacity distribution of the battery derived from the learning data" means that the battery capacity range is designated as a certain standard in the capacity distribution of the battery, and different machine learnings are each carried out depending on the range.

In an embodiment of the present disclosure, the battery may be a secondary battery, but the present disclosure is not limited thereto.

In the present specification, the term "specific time" refers to a time during which a charging and discharging process of an arbitrarily determined battery is performed. For example, when the charging and discharging process of a battery is to be performed for 1 hour, the specific time means 1 hour.

In an embodiment of the present disclosure, the capacity factor learning data of the battery of the device for measuring the capacity of a battery may include battery charge capacity and battery discharge capacity which are measured during charging, discharging, and resting of the battery by corresponding to the capacity measurement value for the rated capacity of an individual battery selected as the learning target, and may further include one or more of battery charge voltage, battery discharge voltage, battery open circuit voltage (OCV), battery charge current, battery discharge current, battery impedance, and battery temperature, but the present disclosure is not limited thereto, and any factor that may affect the capacity of the battery may be included therein.

In an embodiment of the present disclosure, the capacity factor learning data of the battery of the device for measuring the capacity of a battery may include battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the battery by corresponding to the capacity measurement value for the rated capacity of an individual battery selected as the learning target.

In an embodiment of the present disclosure, the capacity factor measurement data of the battery of the device for measuring the capacity of a battery may include one or more of battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the battery selected as the prediction target, but the present disclosure is not limited thereto.

In an embodiment of the present disclosure, the capacity factor measurement data of the battery of the device for measuring the capacity of a battery may include battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the battery selected as the prediction target.

That is, the capacity measurement value for the rated capacity may correspond to a dependent variable value, and the independent variable for estimating the dependent variable value may be said to be a capacity factor.

In the present specification, different machine learning models mean different machine learning algorithms, for example, decision tree and support vector machine (SVM). However, even if the same decision tree algorithms are used, when the properties (hyperparameters) representing the decision tree structure, such as the depth of the tree, the number of leaf nodes, etc., are different, or when the structures of the deep neural networks, for example, input layer, hidden layer, output layer, weight for each node, etc., are different from each other, they are considered to be different machine learning models.

In an embodiment of the present disclosure, the plurality of different machine learnings of the data learning unit may be performed by selecting respective different regression model algorithms, but the type of machine learning is not limited thereto.

More specifically, in an embodiment of the present disclosure, the regression model algorithms may be one or more selected from decision tree, support vector machine (SVM), random forest, partial least square regression, quantile regression, gradient boosting machine, deep neural networks, and generalized linear/nonlinear regression, but the present disclosure is not limited thereto.

Since the technology related to the machine learning is widely known in the technical field to which the present disclosure pertains, a detailed description of the specific learning algorithm will be omitted.

In the present specification, the correlation of the capacity (Y) of the battery with the capacity factors ($X_1, X_2, \ldots X_n$) is derived in the form of equations or rules through machine learning. The capacity factors mean values including voltage, current, capacity, impedance, temperature, etc. that are measured, collected, and stored during charging, discharging, and resting of the battery affecting the capacity of the battery.

Specifically, an embodiment of the derived battery capacity (Y) obtained through machine learning may be expressed by the equation $Y=f(X_1, X_2, \ldots, X_n)$. Here, $f(X_1, X_2, \ldots, X_n)$ means a function form of the capacity factors $(X_1, X_2, \ldots, X_n)$, and includes combinations of all mathematical functions that derive a value equal to or approximately equal to the capacity (Y) of the battery. Here, the combination of the mathematical functions of the capacity factors $(X_1, X_2, \ldots, X_n)$ that most accurately predict the capacity (Y) of the battery is obtained as a result of machine learning for the data in which the capacity and capacity factors of the battery are measured, collected, and stored. That is, a mathematical function combination of capacity factors that minimizes the deviation from an actual value of the capacity (Y) is obtained in the process of performing machine learning.

As another embodiment, a result obtained through machine learning may be expressed as an IF-THEN rule. Here, the IF-THEN rule means that if the capacity factors satisfy a plurality of certain specific conditions $IF\{(X_1, X_2, \ldots, X_n)\}$, the capacity (Y) of the battery has a certain specific value or a value in a specific range (THEN Y=yi). Here, the plurality of specific conditions $IF\{(X_1, X_2, \ldots,$ $X_n$)} mean a set of cases that each individual capacity factors (X1, X2, . . . , Xn) or a function combination composed of several capacity factors has a specific value or a value in a specific range. The plurality of specific conditions IF{($X_1$, $X_2$, . . . , $X_n$)} representing a specific value or a value in a specific range of each individual capacity factors or a function combination composed of several capacity factors may have a hierarchical relational structure between the conditions. That is, some specific conditions may be applied after some other specific conditions are applied first.

Further, when learning data measured, collected, and stored with respect to battery capacity and capacity factors by applying a plurality of machine learning algorithms, for some machine learning methods, learning may be performed without dividing the entire data, or learning may be performed by dividing the entire data into several parts.

When learning is performed by dividing the entire data into several parts, learning may be performed by dividing the entire data into a training dataset for deriving a mathematical correlational formula or IF-THEN rule from the machine learning algorithm and a test dataset for evaluating the corresponding mathematical correlational formula or IF-THEN rule.

Specifically, a method of statistically summing the estimated capacity values derived by applying a plurality of battery capacity prediction models to obtain an average value and determining the average value as the final battery capacity when predicting capacity from newly input capacity factor data after primarily dividing the entire learning data composed of battery capacity and capacity factors for machine learning into several parts, and then performing learning with respect to each of a plurality of machine learning algorithms using each divided dataset, thereby creating the same number of battery capacity prediction models as the learning algorithms may be applied to a partial or full capacity range of the corresponding battery.

Further, the capacity values of batteries disposed on a module, pack or tray, or the capacity values of batteries designed to have the same rated capacity and manufactured under the same manufacturing conditions indicate a distribution having variance, standard deviation, upper and lower limits. A plurality of machine learning models are applied symmetrically or asymmetrically based on the center of the capacity distribution (mean value or median value).

For example, as shown in FIG. 1, the first to third machine learning models may be equally applied according to the capacity interval of an integer multiple or a real number multiple of the standard deviation from the center (mean value or median value) of the capacity distribution toward a side where the capacity value decreases and a side where the capacity value increases, the first to third machine learning models may be applied identically, or different machine learning models may be applied toward the side where the capacity value decreases and the side where the capacity value increases.

Specifically, first, after learning data and creating capacity prediction models using a plurality of machine learning algorithms for a plurality of total capacity intervals disposed on a module, pack, or tray, the accuracy and error reduction rate of the predicted capacity value for each machine learning algorithm are evaluated in the data learning process to determine the priority among the prediction models by such a method that the prediction model with the highest performance (i.e., accuracy and error reduction rate) for each capacity interval is selected as the optimal machine learning model in the corresponding capacity interval.

Next, the capacity value of each battery for each prediction model is predicted using capacity factor measurement data newly measured and collected from individual batteries disposed on a module, pack, or tray and a capacity prediction model derived from a plurality of machine learnings. Thereafter, the capacity value returned by the machine learning prediction model of the previously predetermined priority is determined as the final capacity value of the corresponding battery according to the capacity interval to which the predicted value corresponds.

As an example of this, as shown in FIG. 1, first, the capacity prediction value derived by applying the first machine learning model is allocated as the capacity value of the corresponding battery in the capacity interval of a times the standard deviation or less from the center (mean value or median value) of the preferred capacity distribution toward the side where the capacity value decreases and the side where the capacity value increases. Further, as shown in FIG. 1, the capacity prediction value derived by applying the second machine learning model is allocated as the capacity value of the corresponding battery in the capacity interval of more than a times the standard deviation and equal to or less than b times the standard deviation from the center (mean value or median value) of the capacity distribution outside the capacity range of the battery derived by the first machine learning model toward the side where the capacity value decreases and the side where the capacity value increases.

Similarly, as shown in FIG. 1, learning may be performed by such a method that the capacity prediction value derived by applying the third machine learning model is allocated as the capacity value of the corresponding battery with respect to the outer capacity ranges of the battery capacity range respectively derived by the first and second machine learning models and the capacity interval of more than b times the standard deviation and equal to or less than c times the standard deviation from the center (mean value or median value) of the capacity distribution toward the side where the capacity value decreases and the side where the capacity value increases.

In an embodiment shown in FIG. 1, random forest, gradient boosting machine, and quantile regression may be applied as first to third machine learning methods respectively, but this exemplifies algorithms of the first to third machine learning methods. In addition, learning may be performed in the same manner by applying other machine learning algorithms.

The definitions of the symbols shown in FIG. 1 are as follows.

$D_i$=Input Data $D_o$=Output Data

σ=Capacity standard deviation, a, b, c=integer or real number $D_{a\sigma}$=Capacity value data in the range (aσ) of a times the standard deviation from the center (Mean or Median) of the capacity distribution $D_{b\sigma}$=Capacity value data in the range (bσ) of b times the standard deviation from the center (Mean or Median) of the capacity distribution $D_{c\sigma}$=Capacity value data in the range (cσ) of c times the standard deviation from the center (Mean or Median) of the capacity distribution That is, the combination of machine learning algorithms that show the best performance (accuracy and error reduction rate) for the capacity prediction value is different depending on various conditions such as the type of batteries, the manufacturing method of the batteries, the configuration of batteries disposed on a module, pack, or tray, operating conditions, etc., and is not limited only to the cases presented in the above examples.

The application criterion of a predicted capacity value obtained from the machine learning model follows the priority and capacity interval of the machine learning model determined in advance in the learning process. As an example, coefficient of determination (R squared, $R^2$), mean absolute error (MAE), root mean square error (RMSE), mean absolute percentage error (MAPE), etc. are calculated for each capacity interval to determine the range of the capacity interval having an optimized value. For example, an integer multiple or real number multiple of the standard deviation of the capacity range in which the value of the coefficient of determination becomes the maximum, or the mean absolute error, the root mean square error, or the mean absolute percentage error becomes the minimum, that is, the capacity distribution is obtained, and machine learning algorithms that exhibit the highest accuracy and error reduction rate in each capacity interval are preferentially applied.

A battery is diagnosed as being defective, when the battery capacity value predicted from the machine learning model deviates from upper and lower limits of the rated capacity.

In the present specification, the "input unit" is an interface for receiving various types of necessary data. Specifically, in the present specification, the input unit 10 may be divided into a learning data input unit for receiving learning data and a measurement data input unit for receiving measurement data. More specifically, the "input unit" is an interface for measuring or collecting capacity factors measured or collected under rated capacity conditions, and transferring the measured or collected capacity factor measurement data to a reference value storage unit 30 or a data learning unit 20. A method in which the learning unit receives and transfers data is not particularly limited.

In the present specification, the "data learning unit" is an interface for performing machine learning using the learning data input to the learning data input unit.

In the present specification, the "output unit" is an interface for calculating prediction data by reflecting the results of machine learning. A method in which the output unit calculates data is not particularly limited.

In an embodiment of the present disclosure, the device for measuring the capacity of a battery may further include: a reference value storage unit for storing data measured under a rated capacity condition of the battery; and a capacity state diagnosis unit for comparing the output battery capacity prediction data and results of the data measured under the rated capacity condition of the battery to determine the reliability of the prediction data, diagnose the capacity and state of the battery, and control the battery process depending on the diagnosis result.

In the present specification, the "reference value storage unit" is an interface for storing the capacity factor measurement data measured or collected under the rated capacity condition, calculating a capacity reference value using the capacity factor measurement data, and transferring the capacity reference value to the capacity state diagnosis unit 40. A method in which the reference value storage unit 30 stores data and transfers a specific value is not particularly limited.

All data input, transferred, or calculated to the interface of the measuring device according to the present disclosure may be integrally managed. Here, being integrally managed may include, for example, all actions such as managing all data input, transferred, or calculated to the interface of the measuring device according to the present disclosure by a specific main computer or server, calculating a new value from the managed data, or inputting it as data again to the input unit 10.

In the present specification, the "capacity state diagnosis unit" is an interface for controlling the process of the battery depending on the diagnosis result by comparing the capacity reference value received from the reference value storage unit and the capacity prediction value derived from the data learning unit 20, thereby determining the reliability of the prediction data and diagnosing the capacity and state of the battery.

Such a structure is as shown in FIG. 2 below, and may additionally have a necessary interface other than that shown in FIG. 2 below such as an output unit.

In an embodiment of the present disclosure, the device for measuring the capacity of a battery may use a box plot to compare the output battery capacity prediction data and the actual capacity data result of the battery.

In an embodiment of the present disclosure, determining the reliability of the battery capacity prediction data in the device for measuring the capacity of a battery may be using actual standard capacity distribution of the battery stored in the reference value storage unit, coefficient of determination (R squared, $R^2$), mean absolute error (MAE), root mean square error (RMSE), or mean absolute percentage error (MAPE), but the present disclosure is not limited thereto.

Since the technique related to the method of comparing the data and determining the reliability is widely known in the art to which the present disclosure pertains, a detailed description thereof will be omitted.

In an embodiment of the present disclosure, the battery capacity range of the capacity distribution of the battery in the device for measuring the capacity of a battery may be determined as an integer multiple or a real number multiple of the standard deviation ($\sigma$) based on the center of the capacity distribution.

The center of the capacity distribution may mean an average (Mean) or a center value (Median) of the capacity distribution.

In an embodiment of the present disclosure, the battery capacity range of the capacity distribution of the battery in the device for measuring the capacity of a battery may be determined as an integer multiple or a real number multiple of the standard deviation ($\sigma$) based on the average (Mean) or the center value (Median) of the capacity distribution.

For example, in the present embodiment, the accuracy of the prediction capacity may become the maximum when using the ensemble regression method in the capacity interval that becomes 1.5 times the standard deviation from the center of the capacity distribution, and using the quantile regression method in the capacity interval that is more than 1.5 times the standard deviation.

In an embodiment of the present disclosure, there may be provided a battery management system (BMS) including the device for measuring the capacity of a battery according to the present disclosure. In other words, in an embodiment of the present disclosure, the device for measuring the capacity of a battery may be used in a battery management system (BMS) device.

In an embodiment of the present disclosure, there may be provided a battery management system device including the capacity measuring device including: a learning data input unit; a measurement data input unit; a data learning unit; and an output unit.

In the present specification, a "battery management system (BMS) device" refers to all types of interfaces including a battery management system.

In an embodiment of the present disclosure, there may be provided a mobile apparatus including the management system device according to the present application.

In the present specification, the term "mobile apparatus" refers to an apparatus which may be moved by itself or may be easily transported by a user, and examples of the mobile apparatus may include an electric vehicle, a mobile device, etc.

In an embodiment of the present disclosure, there may be provided a battery management system device in which at least one of: the learning data input unit; the measurement data input unit; the data learning unit; the reference value storage unit; and the capacity state diagnosis unit is remotely controlled.

In an embodiment of the present disclosure, there may be provided a battery management system device in which two or more of: the learning data input unit; the measurement data input unit; the data learning unit; the reference value storage unit; and the capacity state diagnosis unit are remotely controlled.

In an embodiment of the present disclosure, there may be provided a battery management system device in which all of: the learning data input unit; the measurement data input unit; the data learning unit; the reference value storage unit 30; and the capacity state diagnosis unit 40 are remotely controlled.

In the present specification, the meaning of the "being remotely controlled" means that interfaces of the input unit 10, the learning unit, the output unit, etc. are located outside the battery management system device to perform their functions while transmitting or receiving data and signals between the interfaces through communication. For example, a method of the remote control may include a method of managing performance of their functions while transmitting or receiving data and signals between interfaces through communication by placing some of the interfaces in a cloud server, but the present disclosure is not limited thereto, and any method capable of performing their functions outside the battery management system device may be applied to the configuration of the present disclosure.

When some or all interfaces of the device are remotely controlled, it is possible to reduce the weight of the battery management system device so that it is easily applied to a mobile apparatus, and a specific main computer or cloud server is used so that it is easy to integrally manage data, etc. generated in the process of using the device.

Further, when some interfaces of the device are remotely controlled, the cost associated with the computer hardware installed in the mobile apparatus may be reduced by lowering specifications required for memory for data storage, computation, information processing, etc. in relation to a computer hardware (H/W) and enabling the configuration to be simplified.

Further, in an embodiment of the present disclosure, at least one of: the learning data input unit; the measurement data input unit; the data learning unit; the output unit; the reference value storage unit; and the capacity state diagnosis unit of the battery management system device may be embedded in a mobile apparatus.

Further, in an embodiment of the present disclosure, two or more of: the learning data input unit; the measurement data input unit; the data learning unit; the output unit; the reference value storage unit; and the capacity state diagnosis unit of the battery management system device may be embedded in a mobile apparatus.

Further, in an embodiment of the present disclosure, all of: the learning data input unit; the measurement data input unit; the data learning unit; the output unit; the reference value storage unit; and the capacity state diagnosis unit of the battery management system device may be embedded in a mobile apparatus.

In an embodiment of the present disclosure, there may be provided a mobile apparatus in which at least one of: the learning data input unit; the measurement data input unit; the data learning unit; the output unit; the reference value storage unit; and the capacity state diagnosis unit is embedded in the mobile apparatus.

In an embodiment of the present disclosure, there may be provided a mobile apparatus in which two or more of: the learning data input unit; the measurement data input unit; the data learning unit; the output unit; the reference value storage unit; and the capacity state diagnosis unit of the battery management system device are bedded in the mobile apparatus.

In an embodiment of the present disclosure, there may be provided a mobile apparatus in which all of: the learning data input unit; the measurement data input unit; the data learning unit; the reference value storage unit; and the capacity state diagnosis unit are embedded in the mobile apparatus.

In the present specification, the term "being embedded in the mobile apparatus" means that an interface of the above-mentioned input unit, learning unit, output unit, or the like corresponds to one of the components of the mobile apparatus.

When the device is partially or entirely embedded in the mobile apparatus, there is an advantage in that safety problems due to communication problems do not occur.

In an embodiment of the present disclosure, the device for measuring the capacity of a battery, which composes the battery management system device may further include the above-described reference value storage unit; and capacity state diagnosis unit, and the reference value storage unit and the capacity state diagnosis unit may be partially embedded in a remote control or mobile apparatus. If there are additional interfaces available, each of the interfaces may be embedded in a remote control or mobile apparatus.

More specifically, the battery management system refers to a system which performs capacity matching and cell balancing, controls charging or discharging of the battery, and controls and manages the overall state of the battery such as the remaining amount of the battery, battery failure, etc. when the battery management system is mounted on an electric vehicle, a mobile device, etc. and used as a power source. The battery management system (BMS) may be applied to one or more batteries. That is, it is generally applied to a plurality of batteries, but may be applied to one battery, and the battery management system may be individually applied to each battery.

Data generated by the battery management system device may also be integrally managed as described above.

When the device for measuring the capacity of a battery according to the present disclosure is applied to a battery management system device, the accuracy of the measurement of the battery capacity can be improved so that the accuracy of diagnosing the state of the battery and predicting the lifespan of the battery can be improved accordingly. That is, as one or more batteries are mounted on an electric vehicle, a mobile device, etc. and used as power sources, the batteries may be managed more accurately and efficiently by the battery management system when performing an overall battery management such as capacity matching, cell balancing, etc.

In an embodiment of the present disclosure, there is provided a method for measuring the capacity of a battery, the method comprising the steps of: inputting capacity factor learning data of the battery in a charging and discharging process performed for a specific time of a battery selected as a learning target; deriving a capacity distribution of the battery from the input capacity factor learning data of the battery; respectively performing a plurality of different machine learnings for each battery capacity range of the capacity distribution of the battery derived from the learning data; inputting capacity factor measurement data of the battery selected in the charging and discharging process performed for a specific time of a battery selected as a prediction target; calculating battery capacity prediction data from the input capacity factor measurement data of the battery; and outputting battery capacity prediction data respectively calculated for each battery capacity range of the battery capacity distribution derived from the learning data through the results of the plurality of machine learnings.

In an embodiment of the present disclosure, the capacity factor learning data of the battery of the method for measuring the capacity of a battery may include battery charge capacity and battery discharge capacity which are measured during charging, discharging, and resting of the battery by corresponding to the capacity measurement value for the rated capacity of an individual battery selected as the learning target, and may further include one or more of battery charge voltage, battery discharge voltage, battery open circuit voltage (OCV), battery charge current, battery discharge current, battery impedance, and battery temperature, but the present disclosure is not limited thereto, and any factor that may affect the capacity of the battery may be included therein.

In an embodiment of the present disclosure, the capacity factor learning data of the battery of the method for measuring the capacity of a battery may include battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the battery by corresponding to the capacity measurement value for the rated capacity of an individual battery selected as the learning target.

In an embodiment of the present disclosure, the capacity factor measurement data of the battery of the method for measuring the capacity of a battery may include one or more of battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the battery selected as the prediction target, but the present disclosure is not limited thereto.

In an embodiment of the present disclosure, the capacity factor measurement data of the battery of the method for measuring the capacity of a battery may include battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the battery selected as the prediction target.

In an embodiment of the present disclosure, the step of performing machine learning on the input learning data may be performed by selecting one or more of decision tree, support vector machine (SVM), random forest, partial least square regression, quantile regression, gradient boosting machine, deep neural networks, and generalized linear/nonlinear regression, but the present disclosure is not limited thereto. For example, in the present embodiment, the accuracy of the prediction capacity may become the maximum when using the ensemble regression method in the capacity interval that becomes 1.5 times the standard deviation from the center of the capacity distribution, and using the quantile regression method in the capacity interval that is more than 1.5 times the standard deviation.

In an embodiment of the present disclosure, the method for measuring the capacity of a battery may further comprise the steps of: storing the actual capacity data of the battery; and comparing the output battery capacity prediction data and the actual capacity data result of the battery to determine the reliability of the battery capacity prediction data.

In an embodiment of the present disclosure, comparing the output battery capacity prediction data and the actual capacity data result of the battery in the method for measuring the capacity of a battery may be using a box plot, but the present disclosure is not limited thereto.

In an embodiment of the present disclosure, the step of determining the reliability of the battery capacity prediction data may be using actual standard capacity distribution of the battery stored in the reference value storage unit, coefficient of determination (R squared, $R^2$), mean absolute error (MAE), root mean square error (RMSE), or mean absolute percentage error (MAPE), but the present disclosure is not limited thereto.

In an embodiment of the present disclosure, the battery capacity range of the capacity distribution of the battery in the method for measuring the capacity of a battery may be determined as an integer multiple or a real number multiple of the standard deviation ($\sigma$) based on the center of the capacity distribution.

The center of the capacity distribution may mean an average (Mean) or a center value (Median) of the capacity distribution.

In an embodiment of the present disclosure, the battery capacity range of the capacity distribution of the battery in the method for measuring the capacity of a battery may be determined as an integer multiple or a real number multiple of the standard deviation ($\sigma$) based on the average (Mean) or the center value (Median) of the capacity distribution.

In an embodiment of the present disclosure, the plurality of machine learnings may be connected in parallel.

In an embodiment of the present disclosure, the method for measuring the capacity of a battery may be a method used in the battery management system (BMS). That is, in an embodiment of the present disclosure, the battery management system may perform the function of the battery management system described above by using the method for measuring the capacity of a battery according to the present disclosure.

In this case also as described above, as one or more batteries are mounted on an electric vehicle, a mobile device, etc. and used as power sources, the batteries may be managed more accurately and efficiently by the battery management system when performing an overall battery management such as capacity matching, cell balancing, etc.

In the present specification, the description applied to the device for measuring the capacity of a battery according to the embodiment of the present disclosure may also be applied to the method for measuring the capacity of a battery according to the embodiment of the present disclosure.

The device and method for measuring the capacity of a battery according to the present application apply a method capable of maximizing the accuracy among a plurality of machine learning methods to capacity factor learning data of the battery for each capacity interval so that the accuracy and precision of battery capacity prediction can be improved. Through this, the efficiency of battery state diagnosis and quality control can be improved, and process optimization and production efficiency can be increased ultimately.

When a plurality of batteries in the form of a module, a pack, and a tray are mounted on an electric vehicle, a mobile device, etc. and used as power sources, the device and method for measuring the capacity of a battery according to the embodiment of the present application can improve the accuracy of the measured capacity of individual batteries when performing capacity matching and cell balancing, and as a result, the lifespan of the batteries in the form of the module, pack, and tray can be improved.

An embodiment of the present disclosure provides a computer program stored in a recording medium for executing the method for measuring the capacity of a battery according to the present disclosure. The aforementioned description of the method for measuring the capacity of a battery may be applied in the same manner except that each step of the method for measuring the capacity of a battery is stored in a recording medium in the form of a computer program.

Mode for Carrying Out the Invention

The process of the method for measuring the capacity of a battery will be described in more detail as follows.

EXAMPLE

After disposing one or more batteries to be learned on a module, pack, and tray, and measuring and collecting battery capacity factors such as charge voltages, discharge voltages, open circuit voltages (OCV), charge currents, discharge currents, charge capacities, discharge capacities, impedances, and temperatures of the disposed batteries while performing the charging and discharging process of the batteries by corresponding to the capacity measurement value for the rated capacity, the values were stored in a storage medium as capacity factor learning data.

Thereafter, the capacity distribution was derived from the measured and collected capacity factor learning data, machine learning was performed using the first to third machine learning models for each battery capacity range of the capacity distribution derived from the learning data, and three battery capacity prediction models were derived through this.

Specifically, the capacity prediction value derived by applying the first machine learning model was allocated as the capacity value of the corresponding battery within the range of 1.5 times the standard deviation based on the center of the capacity distribution, and the capacity prediction value derived by applying the second machine learning model was allocated as the capacity value of the corresponding battery with respect to the capacity range of the battery derived by the first machine learning model, that is, the case that is outside the range of 1.5 times the standard deviation based on the center of the capacity distribution. More specifically, the capacity range of the battery to which the second machine learning model is applied means a range of 1.5 to 2 times the standard deviation.

Similarly, when the capacity of the battery derived by applying the first and second machine learning models was out of the range, that is, when it was deviated twice the standard deviation, the capacity prediction value derived by applying the third machine learning model was allocated as the capacity value of the corresponding battery.

More specifically, the random forest (first machine learning model) was applied within the range of 1.5 times the standard deviation based on the center of the capacity distribution, and the gradient boosting machine (second machine learning model) algorithm was applied to the range of 1.5 to 2 times the standard deviation based on the center of the capacity distribution.

Finally, the quantile regression (third machine learning model) algorithm was applied with respect to the range that was deviated two times the standard deviation based on the center of the capacity distribution.

Further, two ensemble methods of a bagging algorithm and a boosting algorithm were used in this process.

At this time, the accuracy became the maximum when the bagging and boosting algorithms were applied from the center of the dispersion to the capacity interval of 1.5 to 2 times the standard deviation, and the accuracy became the maximum when applying the quantile regression method in the outer capacity interval thereof.

Thereafter, after disposing one or more batteries whose capacities were to be predicted on a module, pack, and tray, and measuring and collecting battery capacity factors such as charge voltages, discharge voltages, open circuit voltages (OCV), charge currents, discharge currents, charge capacities, discharge capacities, impedances, and temperatures of the disposed batteries while performing the charging and discharging process of the batteries, the values were stored in a storage medium as capacity factor measurement data.

Thereafter, battery capacity prediction data was calculated by applying the three derived battery capacity measurement models to the capacity factor measurement data.

Next, the battery capacity distribution was derived to predict the battery capacity by outputting the calculated battery capacity prediction data for each capacity range of the capacity distribution derived from the capacity factor learning data.

COMPARATIVE EXAMPLE

Further, battery capacity prediction data was derived (comparative example) in the same manner except that the linear regression equation was applied as a single machine learning algorithm.

The derivation results according to Example and Comparative Example are shown through the capacity distribution comparison diagram of FIG. 3 and the box plot of FIG. 4.

The meanings of (a) to (d) in FIGS. 3 and 4 are as follows.

(a) rated capacity (b) capacity calculated by a single machine learning (ML) method (c) capacity calculated by a plurality of machine learning (ML) methods (Example of the present disclosure)

(d) capacity calculated by the linear regression equation

It could be visually confirmed from the results of FIGS. 3 and 4 that the difference between the measurement data and the prediction data was not large and the accuracy was excellent in the case of the device and method for measuring the capacity of a battery according to the embodiment of the present application.

Finally, the actual capacity data of the battery was compared with the output battery capacity prediction data to determine the reliability of the battery capacity prediction data by deriving $R^2$.

Further, the battery capacity prediction data was derived to determine the reliability thereof by deriving $R^2$ in the same manner except that a single machine learning algorithm was applied.

As a result, it was confirmed that $R^2$ was improved by 20% or more in the device and method for measuring the capacity of a battery according to the embodiment of the present application compared to the case where the battery capacity was measured in the same manner except that a single machine learning algorithm was applied.

REFERENCE NUMERALS

10: Input unit
20: Data learning unit
30: Reference value storage unit
40: Capacity determination/state diagnosis unit
50: Secondary battery

The invention claimed is:

1. A device for measuring battery capacity, the device including:

an input interface configured to receive:

capacity factor learning data measured in a first charging and discharging process performed for a specific time on a single learning battery selected as a learning target; and capacity factor measurement data measured in a second charging and discharging process performed for a prediction battery selected as a prediction target;

a computing device configured to:

derive a capacity distribution of the prediction battery from the capacity factor learning data, wherein the capacity distribution classifies the capacity factor measurement data into a plurality of battery capacity ranges;

for each battery capacity range of the capacity distribution of the prediction battery derived from the capacity factor learning data, derive a respective model-specific capacity prediction result using a different respective machine learning program; and calculate capacity prediction data of the prediction battery based on the respective model-specific capacity prediction results of two or more of the different respective machine learning programs; and an output interface configured to output the calculated capacity prediction data, wherein the capacity factor learning data includes battery charge capacity and battery discharge capacity which are measured during charging, discharging, and resting of the battery by corresponding to the capacity measurement value for the rated capacity of the learning battery, and further includes one or more of battery charge voltage, battery discharge voltage, battery open circuit voltage (OCV), battery charge current, battery discharge current, battery impedance, and battery temperature, and wherein the capacity factor measurement data includes one or more of battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the prediction battery.

2. The device of claim 1, wherein the two or more different respective machine learning programs are different respective regression model algorithms.

3. The device of claim 2, wherein the different respective regression model algorithms include one or more of a decision tree, support vector machine (SVM), random forest, partial least square regression, quantile regression, gradient boosting machine, deep neural networks, and generalized linear/nonlinear regression.

4. The device of claim 1, further including:

memory configured to store data measured under a rated capacity condition of the prediction battery, wherein the computing device is configured to compare the battery capacity prediction data and results of the data measured under the rated capacity condition of the prediction battery to determine a reliability of the battery capacity prediction data, diagnose a capacity and state of the prediction battery, and control battery operation depending on the diagnosis of the capacity and state of the prediction battery.

5. The device of claim 4, wherein the computing device is configured to determine the reliability of the battery capacity prediction data based on the capacity distribution measured under the rated capacity condition of the prediction battery stored in the memory, a coefficient of determination, a mean absolute error, a root mean square error, or a mean absolute percentage error.

6. The device of claim 1, wherein each battery capacity range of the capacity distribution of the prediction battery is determined by an integer multiple or a real number multiple of a standard deviation based on a mean or median of the capacity distribution.

7. A method for measuring battery capacity, the method comprising:

receiving, by an input interface, capacity factor learning data in a first charging and discharging process performed for a specific time of a learning battery selected as a learning target;

deriving, by a computing device, a capacity distribution of the from the input capacity factor learning data, wherein the capacity distribution classifies the capacity factor measurement data into a plurality of battery capacity ranges;

for each battery capacity range of the capacity distribution of the prediction battery derived from the capacity factor learning data, deriving, by the computing device, a respective model-specific capacity prediction result using a different respective machine learning program;

receiving, by the input interface, capacity factor measurement data measured in a second charging and discharging process performed for a prediction battery selected as a prediction target;

calculating, by the computing device, capacity prediction data of the prediction battery based on the respective model-specific capacity prediction results of two or more of the different respective machine learning programs; and outputting, by an output interface, the calculated capacity prediction data, wherein the capacity factor learning data includes battery charge capacity and battery discharge capacity which are measured during charging, discharging, and resting of the battery by corresponding to the capacity measurement value for the rated capacity of the learning battery, and may further include one or more of battery charge voltage, battery discharge voltage, battery open circuit voltage (OCV), battery charge current, battery discharge current, battery impedance, and battery temperature, and wherein the capacity factor measurement data includes one or more of battery charge voltage, battery discharge voltage, battery open circuit voltage (OCV), battery charge current, battery discharge current, battery charge capacity, battery discharge capacity, battery impedance, and battery temperature which are measured during charging, discharging, and resting of the prediction battery.

8. The method of claim 7, wherein the two or more different respective machine learning programs are different respective regression model algorithms.

9. The method of claim 8, wherein the different respective regression model algorithms include one or more of a decision tree, support vector machine (SVM), random forest, partial least square regression, quantile regression, gradient boosting machine, deep neural networks, and generalized linear/nonlinear regression.

10. The method of claim 7, further comprising: storing, by memory, data measured under a rated capacity condition of the prediction battery; and comparing, by the computing device, the battery capacity prediction data and results of the data measured under the rated capacity condition of the prediction battery to determine a reliability of the battery capacity prediction data.

11. The method of claim 10, wherein determining the reliability of the battery capacity prediction data is based on capacity distribution measured under the rated capacity condition of the prediction battery stored in the memory, a coefficient of determination, a mean absolute error, a root mean square error, or a mean absolute percentage error.

12. The method of claim 7, wherein each battery capacity range of the capacity distribution of the prediction battery is determined by an integer multiple or a real number multiple of a standard deviation) based on a mean or median of the capacity distribution.

13. A battery management system (BMS) device including the device according to claim 1.

14. The battery management system device of claim 13, wherein at least one of: the input interface; the computing device; or the output interface is remotely controlled.

15. A mobile apparatus including the battery management system device according to claim 13.

16. The mobile apparatus of claim 15, wherein at least one of: the input interface; the computing device; or the output interface is embedded in the mobile apparatus.

* * * * *